US012796463B2

(12) United States Patent
Matsumoto et al.

(10) Patent No.: US 12,796,463 B2
(45) Date of Patent: Nov. 10, 2026

(54) SEMICONDUCTOR PACKAGING STRUCTURE WITH GRAPHITE SHEETS

(71) Applicant: International Business Machines Corporation, Armonk, NY (US)

(72) Inventors: Keiji Matsumoto, Yokohama (JP); Mukta Ghate Farooq, Hopewell Junction, NY (US); John Knickerbocker, Monroe, NY (US); John W Golz, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 385 days.

(21) Appl. No.: 18/543,589

(22) Filed: Dec. 18, 2023

(65) Prior Publication Data

US 2025/0201656 A1 Jun. 19, 2025

(51) Int. Cl.

| | |
|---|---|
| ***H10W 70/685*** | (2026.01) |
| ***H10W 40/22*** | (2026.01) |
| ***H10W 40/25*** | (2026.01) |
| ***H10W 70/695*** | (2026.01) |
| ***H10W 90/00*** | (2026.01) |
| *H10W 70/60* | (2026.01) |
| *H10W 74/15* | (2026.01) |

(52) U.S. Cl.

CPC ......... *H10W 40/25* (2026.01); *H10W 40/228* (2026.01); *H10W 70/685* (2026.01); *H10W 70/695* (2026.01); *H10W 90/00* (2026.01); *H10W 70/60* (2026.01); *H10W 74/15* (2026.01); *H10W 90/724* (2026.01); *H10W 90/734* (2026.01)

(58) Field of Classification Search

CPC ............................ H10W 70/685; H10W 70/60

See application file for complete search history.

(56) References Cited

U.S. PATENT DOCUMENTS

| | | | |
|---|---|---|---|
| 9,312,239 | B2 | 4/2016 | Haba et al. |
| 10,249,551 | B2 | 4/2019 | Standing |
| 2007/0257359 | A1 | 11/2007 | Reis et al. |

(Continued)

FOREIGN PATENT DOCUMENTS

| | | | |
|---|---|---|---|
| JP | 2011000884 | A | 1/2011 |
| JP | 5954008 | B2 | 7/2016 |

(Continued)

OTHER PUBLICATIONS

Lemak, R. J., et al., "High Performance Pyrolytic Graphite Composite Heat Spreaders", IMAPS Advanced Technology Workshop on Thermal Management 2011, Nov. 7-9, 2011, 26 pages, Palo Alto, CA USA.

(Continued)

*Primary Examiner* — Michele Fan

(74) *Attorney, Agent, or Firm* — Scully, Scott, Murphy & Presser, P.C.; Kristofer Haggerty

(57) ABSTRACT

Semiconductor packaging structures are provided in which a graphite sheet is used for thermal conduction of heat generated by a semiconductor chip to a foot of a heat spreader that is thermally connected to the graphite sheet. The graphite sheet can be present in a frontside laminate or in an upper portion of frontside build-up layers of an organic substrate core.

20 Claims, 5 Drawing Sheets

(56) References Cited

U.S. PATENT DOCUMENTS

| | | | | |
|---|---|---|---|---|
| 2021/0305121 | A1 | 9/2021 | Mallik et al. | |
| 2023/0317674 | A1 * | 10/2023 | Shih | H10W 20/42<br>257/774 |
| 2025/0096185 | A1 * | 3/2025 | Chen | H10W 70/095 |

FOREIGN PATENT DOCUMENTS

| | | | |
|---|---|---|---|
| JP | 2019021889 | A | 2/2019 |
| JP | 6566554 | B2 | 8/2019 |

OTHER PUBLICATIONS

Xu, b., et al., “Ultra-high-performance heat spreader based on a graphite architecture with threedimensional thermal routing”, Cell Reports Physical Science 2, Nov. 17, 2021, 13 pages, 100621.

* cited by examiner

SEMICONDUCTOR PACKAGING STRUCTURE WITH GRAPHITE SHEETS

BACKGROUND

The present application relates to semiconductor technology, and more particularly to semiconductor packaging structures having a thermal conduction path provided by a graphite sheet.

Semiconductor packaging is a crucial aspect of electronics manufacturing that involves enclosing semiconductor chips in protective and functional packages to ensure their reliability, performance and integration into electronic devices. These packages serve as a bridge between the tiny, sensitive semiconductor chips and the broader electronic systems, providing electrical connections, thermal management, and environmental protection. Semiconductor packaging technologies have evolved significantly to meet the demands of smaller, faster, and more efficient electronic devices, ranging from traditional leaded packages to advanced flip-chip, system-in-package (SiP), and 3D packaging. These packaging innovations play a vital role in powering a wide range of modern applications, from smartphones and IoT devices to data centers and automotive electronics.

SUMMARY

Semiconductor packaging structures including a thermal graphite sheet either in a laminate that is in close proximity to the semiconductor chips, or in frontside build-up layers of an organic substrate core are provided. The graphite sheet serves as a thermal conduction path which can effectively conduct heat generated by semiconductor chips into a foot of a heat spreader. By sandwiching the graphite sheet between two electrically conductive layers, coefficient of thermal expansion (CTE) mismatch within the laminate or frontside build-up layers can be minimized. By including a graphite sheet (with CTE controlled electrically conductive layers) on the backside of the organic substrate core, warpage of the semiconductor packaging structure can be minimized.

In an aspect of the present application, a semiconductor packaging structure is provided. In a first embodiment, the semiconductor packaging structure includes an organic substrate core having a frontside and a backside. A first electrically conductive structure extends from the frontside to the backside of the organic substrate core. The semiconductor packaging structure of the first embodiment further includes frontside build-up layers located on the frontside of the organic substrate core. The frontside build-up layers include a plurality of second electrically conductive structures, wherein at least one of the second electrically conductive structures is in electrical contact with the first electrically conductive structure. The semiconductor packaging structure of the first embodiment further includes backside build-up layers located directly on the backside of the organic substrate core. The backside build-up layers include a plurality of third electrically conductive structures, wherein at least one of the third electrically conductive structures is in electrical contact with the first electrically conductive structure. The semiconductor packaging structure of the first embodiment further includes a frontside laminate including a first frontside graphite sheet located on an uppermost surface of the frontside build-up layers.

In a second embodiment, the semiconductor packaging structure includes an organic substrate core having a frontside and a backside. A first electrically conductive structure extends from the frontside to the backside of the organic substrate core. The semiconductor packaging structure of the second embodiment further includes frontside build-up layers located on the frontside of the organic substrate core. The frontside build-up layers include a first frontside graphite sheet and a plurality of second electrically conductive structures. In the second embodiment, the frontside graphite sheet is located in upper portion of the frontside build-up layers and at least one of the second electrically conductive structures is in electrical contact with the first electrically conductive structure. The semiconductor packaging structure of the second embodiment further includes backside build-up layers located directly on the backside of the organic substrate core. The backside build-up layers include a plurality of third electrically conductive structures. In the second embodiment, at least one of the third electrically conductive structures is in electrical contact with the first electrically conductive structure.

DETAILED DESCRIPTION

Figure 1:
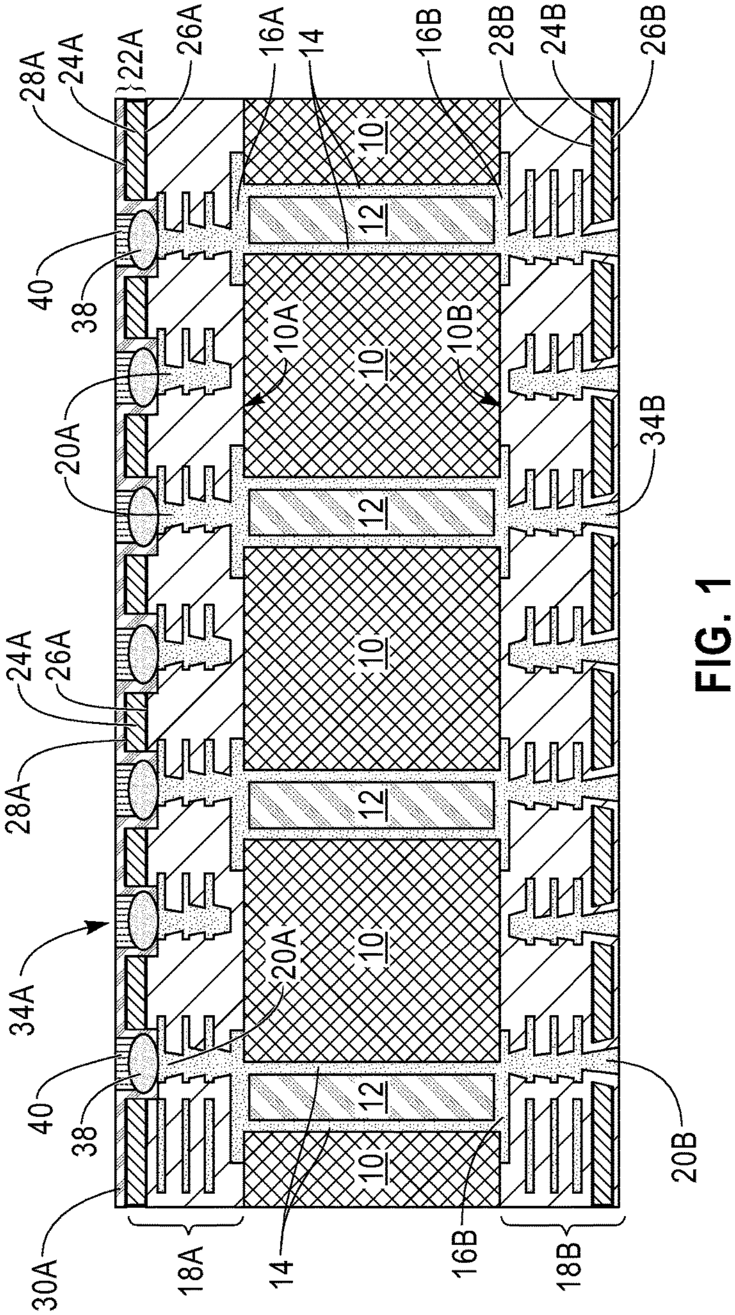
FIG. 1 is cross sectional view of a portion of a semiconductor packing structure in accordance with a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

Three-dimensional integration (3Di) is one of the most prominent examples of heterogeneous integration. However, 3Di has thermal challenges because of higher heat density than conventional 2D packages. Especially, a bottom chip of the 3Di tends to be a high-heat-dissipating chip because it has many electrical interconnects with a substrate and is highly functional such as a logic. In conventional cooling from the top side of the 3Di, generated heat of a bottom chip needs to go through the 3Di and efficient cooling is hard to realize. Therefore, it is preferable to dissipate the generated heat of a bottom chip directly from the organic substrate core (laminate) side. Additionally, in backside power distribution network (BSPDN), there is an additional thermal resistance (frontside back-end-of-the-line (BEOL)) which requires an additional thermal challenge to cope with. A solution to the above thermal challenges is needed.

The present application solves the above thermal challenges by providing a semiconductor packaging structure including a thermal graphite sheet either in a laminate, or in a frontside build-up layers. The graphite sheet serves as a thermal conduction path which can effectively conduct heat generated by semiconductor chips into a foot of a heat spreader. By sandwiching the graphite sheet between two electrically conductive layers, coefficient of thermal expansion (CTE) mismatch within the laminate or frontside build-up layers can be minimized. By including a graphite sheet (with CTE controlled electrically conductive layers) on the backside of the organic substrate core, warpage of the semiconductor packaging structure can be minimized.

Figure 2:
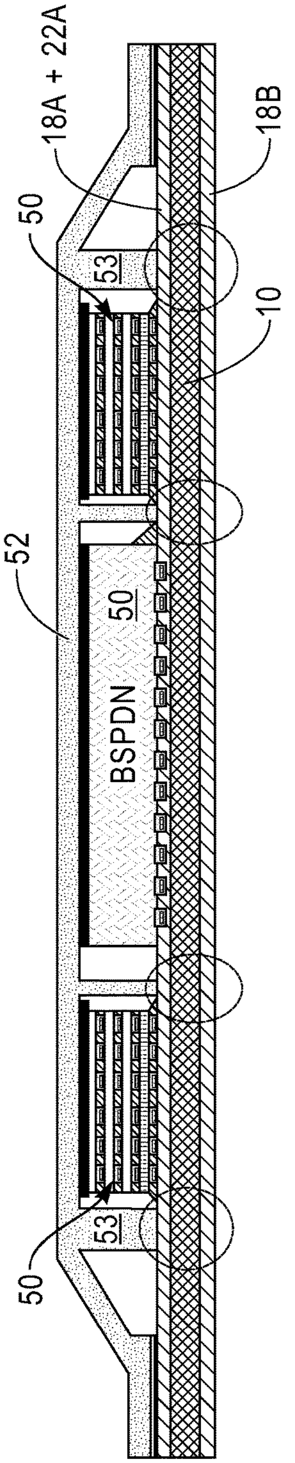
FIG. 2 is a cross sectional view of the semiconductor packing structure illustrated in FIG. 1 including semiconductor chips and a heat spreader.
Figure 3:
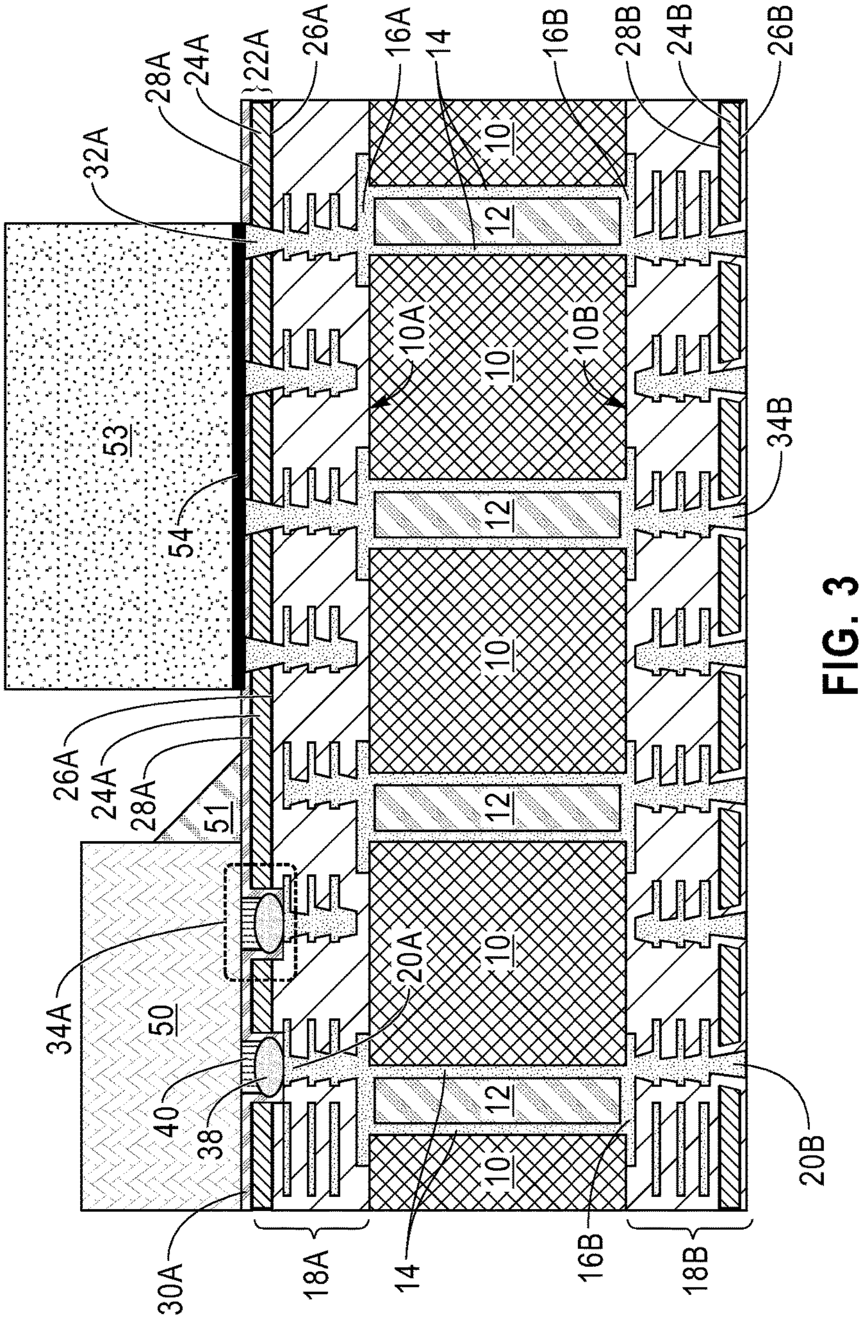
FIG. 3 is an enlarged cross sectional view of the semiconductor packing structure illustrated in FIG. 2.

In a first embodiment and as is illustrated, for example, in FIGS. 1, 2 and 3, the semiconductor packaging structure includes an organic substrate core 10 having a frontside 10A and a backside 10B. A first electrically conductive structure 12/14 extends from the frontside 10A to the backside 10B of the organic substrate core 10. In the present application, the "electrically conductive structure" includes polymer 12 that has an electrically conductive metal or electrically conductive metal liner 14 located along the sidewalls of the polymer 12. The semiconductor packaging structure of the first embodiment further includes frontside build-up layers 18A located on the frontside 10A of the organic substrate core 10. The frontside build-up layers 18A include a plurality of second electrically conductive structures 20A, wherein at least one of the second electrically conductive structures 20A is in electrical contact with the first electrically conductive structure 12/14. The semiconductor packaging structure of the first embodiment further includes backside build-up layers 18B located directly on the backside 10B of the organic substrate core 10. The backside build-up layers 18B include a plurality of third electrically conductive structures 20B, wherein at least one of the third electrically conductive structures 20B is in electrical contact with the first electrically conductive structure 12/14. The semiconductor packaging structure of the first embodiment further includes a frontside laminate 22A including a first frontside graphite sheet 24A located on an uppermost surface of the frontside build-up layers 18A. The first frontside graphite sheet 24A provides a thermal conductive path in which heat generated by a semiconductor chip 50 can be transferred though the first frontside graphite sheet 24A into the footer 53 of the thermal spreader 52.

In the first embodiment and as is shown, for example, in FIGS. 1 and 3, the frontside laminate 22A can further include a first electrically conductive layer 26A and a second electrically conductive layer 28A, wherein the first frontside graphite sheet 24A is sandwiched between the first electrically conductive layer 26A and the second electrically conductive layer 28A. The inclusion of the first and second electrically conductive layers 26A, 28A aids in minimizing the CTE mismatch in the frontside laminate 22A. A CTE matched first frontside graphite sheet is thus formed.

In the first embodiment and as is shown, for example, in FIGS. 1 and 3, the semiconductor packaging structure can further include a first backside graphite sheet 24B that is located in the backside build-up layers 18B. In other embodiments (not shown), a backside laminate can be present on the backside build-up layers that includes the first backside graphite sheet 24B. By including first frontside graphite sheet 24A and first backside graphite sheet 24B in the semiconductor packaging structure, a semiconductor packaging structure have reduced stress is provided. Reduced stress within the semiconductor packaging structure minimizes warpage. Reduced stress and hence minimized warpage is critical for large-sized package structures which are more susceptible to warping than small-sized packaging structures. Large sized chips correspond to chips which are larger than 10 mm×10 mm.

In embodiments including the first backside graphite sheet 24B (See, for example, FIGS. 1 and 3), the first backside graphite sheet 24B can be sandwiched between a third electrically conductive layer 26B and a fourth electrically conductive layer 28B. The inclusion of the third and fourth electrically conductive layers 26B, 28B aids in minimizing the CTE mismatch in the backside build-up layers 18B or backside laminate (not shown). A CTE matched first backside graphite sheet is thus formed.

In the first embodiment (See, for example, FIG. 3), the frontside laminate 22A can further include a thermal via 32A. In the present application, and is illustrated in FIG. 4B, thermal via 32A is in contact with the first frontside graphite sheet 24A; no dielectric is located between the thermal via 32A and the first frontside graphite sheet 24A. Thermal via 32A facilitates a vertical thermal conduction path. In the present application, heat is carried away from the semiconductor chip 50 through the first frontside graphite sheet 24A and the heat is then passed vertically upwards from the foot 53 into the remaining body of the heater spreader 52.

In the first embodiment and as is illustrated in FIGS. 2 and 3, the semiconductor packaging structure can further include semiconductor chip 50 located on the frontside laminate 22A. The semiconductor chip 50 is in electrical contact with the at least one second electrically conductive structures 20A that is in electrical contact with first electrically conductive structure 12/14. In the present application, electrical current passes through the structure predominately in a vertical direction.

Figure 4A:
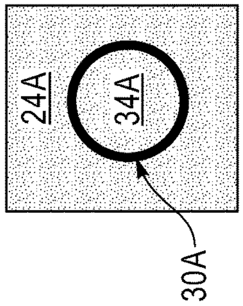
FIG. 4A is a top down view showing an electrical via that is present in the semiconductor packing structure shown in FIGS. 2 and 3.
Figure 4B:
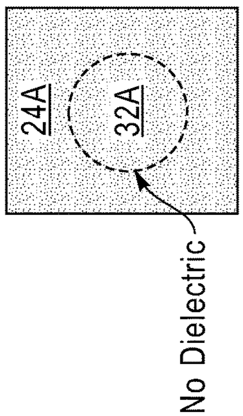
FIG. 4B is a top down view showing a thermal via that is present in the semiconductor packing structure shown in FIGS. 2 and 3.

In the first embodiment and as in FIGS. 1, 3 and 4A, the frontside laminate 22A can further include an electrical via 34A for facilitating the electrical contact of the semiconductor chip 50 with the at least one second electrically conductive structure 20A that is in electrical contact with the first electrically conductive structure 12/14. In the present application, and to prevent shorting, the electrical via 34A is isolated from the first frontside graphite sheet 24A by a frontside dielectric material 30. Electrical via 34A can be referred to a frontside electrical via. Backside electrical vias 34B can be present on the backside of the structure as well.

In the first embodiment and as is shown in FIGS. 2 and 3, the semiconductor packaging structure can further include heat spreader 52 having at least one foot 53 (efficient heat transfer is provided one the heat spreader 52 contains more than one foot 53) in contact with the first frontside graphite sheet 24A. The heat spreader 52 can function as a heat sink in the semiconductor packaging structure of the present application.

In the first embodiment and as is shown in FIGS. 2 and 3, the at least one foot 53 of the heat spreader 52 is in contact with the frontside laminate 24A by a thermal interface material 54. Thermal interface material 54 facilitates the dissipation of heat from the first frontside graphite sheet 24A into the foot 53 of the thermal spreader 52.

Figure 9:
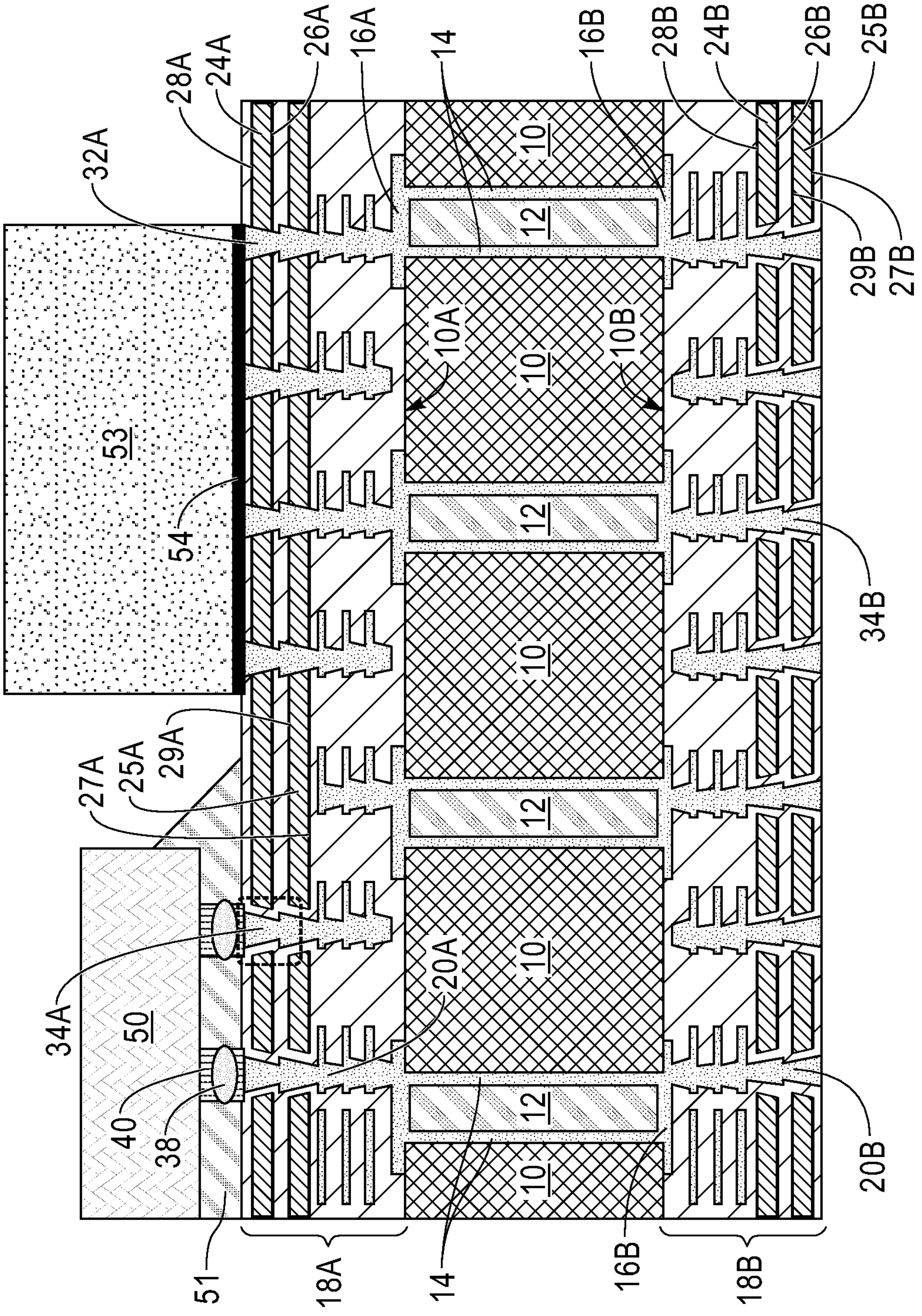
FIG. 9 is an enlarged cross sectional view of a semiconductor packing structure in accordance with the present application including backside and frontside capacitors.

In the first embodiment (not shown, but readily discernable by the structure shown in FIG. 9), the frontside laminate 22A can further include a second frontside graphite sheet 25A spaced apart from the first frontside graphite sheet 24A by a frontside dielectric material 30. In such an embodiment, the first frontside graphite sheet 24A, the frontside dielectric material 30 and the second frontside graphite sheet 25A form a frontside capacitor.

In the first embodiment (not shown, but readily discernable by the structure shown in FIG. 9), the semiconductor packaging structure can further include a first backside graphite sheet 24B and a second graphite sheet 25B located in the backside build-up layers 18B, wherein the first backside graphite sheet 24B and the second frontside graphite sheet 25B are spaced apart by a backside build-up dielectric material, wherein the first backside graphite sheet 24B, the second backside graphite sheet 25B and the backside build-up dielectric material provide a backside capacitor. In some embodiments, the backside capacitor can be present in a backside laminate that can be located on the backside build-up layers 18B.

Figure 5:
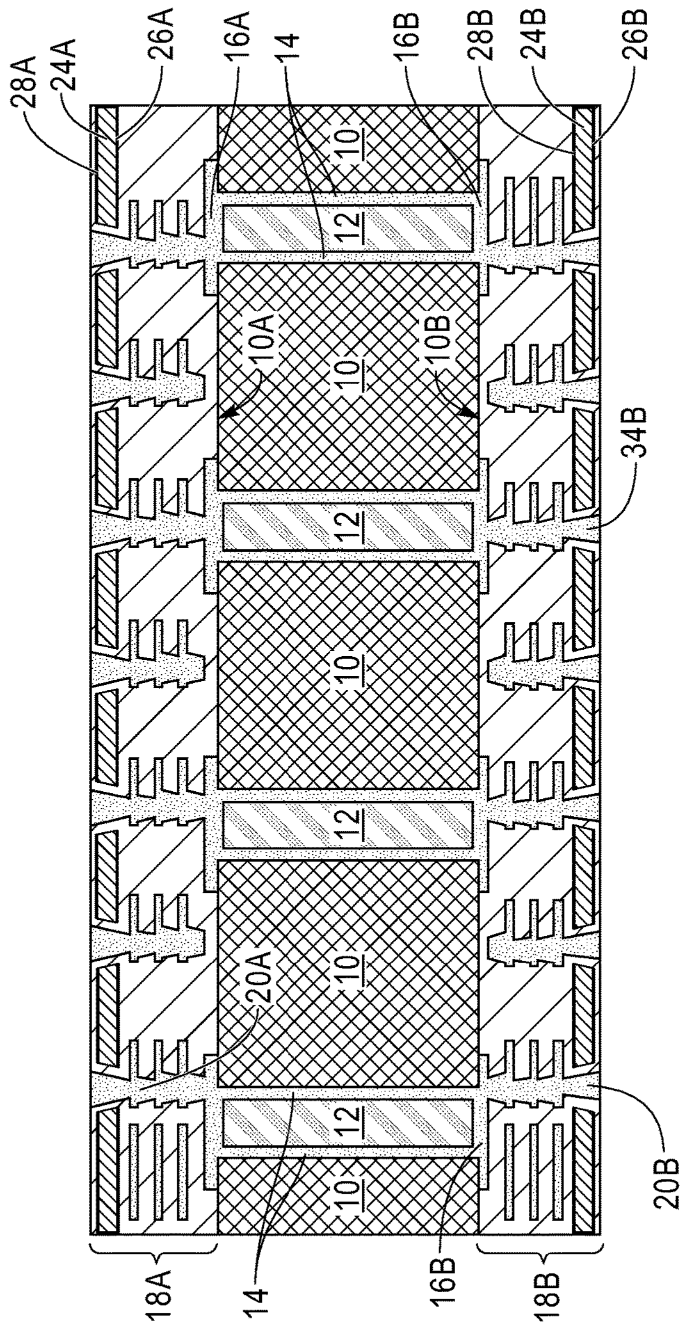
FIG. 5 is cross sectional view of a portion of a semiconductor packing structure in accordance with a second embodiment of the present application.
Figure 6:
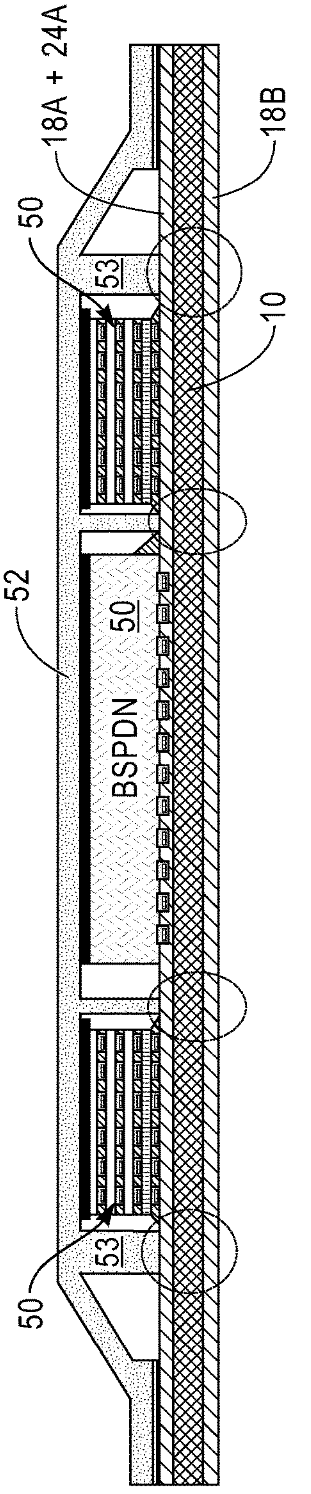
FIG. 6 is a cross sectional view of the semiconductor packing structure illustrated in FIG. 5 including semiconductor chips and a heat spreader.
Figure 7:
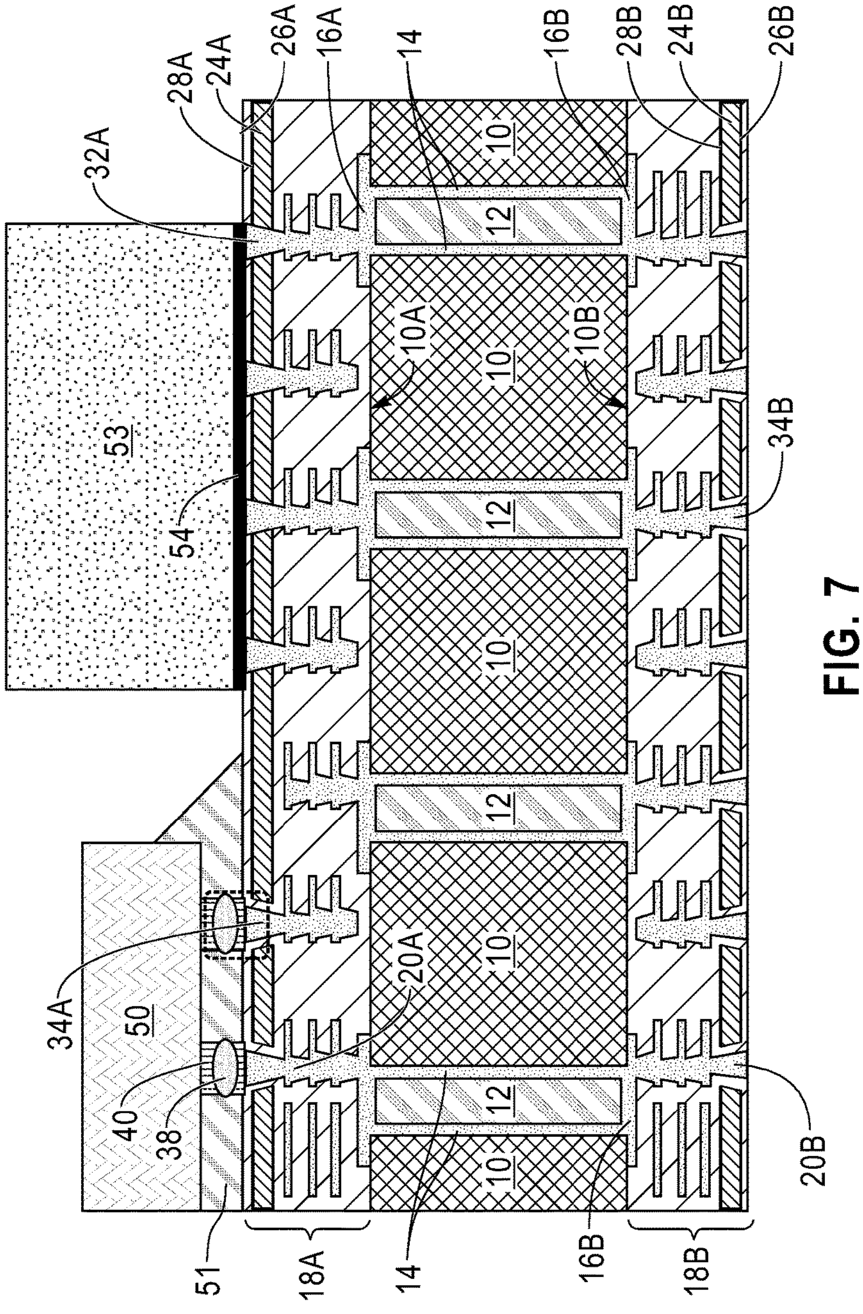
FIG. 7 is an enlarged cross sectional view of the semiconductor packing structure illustrated in FIG. 6.

In a second embodiment and as is shown, for example, in FIGS. 5, 6 and 7, the semiconductor packaging structure includes an organic substrate core 10 having a frontside 10A and a backside 10. A first electrically conductive structure 12/14 extends from the frontside 10A to the backside 10B of the organic substrate core 10. The semiconductor packaging structure of the second embodiment further includes frontside build-up layers 18A located on the frontside 10A of the organic substrate core 10. The frontside build-up layers 18A include a first frontside graphite sheet 24A and a plurality of second electrically conductive structures 20A. In the second embodiment, the frontside graphite sheet 24A is located in upper portion of the frontside build-up layers 18A and at least one of the second electrically conductive structures 20A is in electrical contact with the first electrically conductive structure 12/14. The semiconductor packaging structure of the second embodiment further includes backside build-up layers 18B located directly on the backside 10B of the organic substrate core 10. The backside build-up layers 18B include a plurality of third electrically conductive structures 20B. In the second embodiment, at least one of the third electrically conductive structures 20B is in electrical contact with the first electrically conductive structure 12/14. In the second embodiment, the first frontside graphite sheet 24A provides a thermal conductive path in which heat generated by semiconductor chip 50 can be transferred though the this graphite sheet into thermal spreader 52.

In the second embodiment and as is shown in FIGS. 5 and 7, the semiconductor packaging structure can further include a first backside graphite sheet 24B located in a bottom portion of the backside build-up layers 18B. By including first frontside graphite sheet 24A and first backside graphite sheet 24B in the semiconductor packaging structure, a structure having reduced stress, and minimized warpage is provided.

In the second embodiment and as is shown in FIGS. 5 and 7, the frontside build-up layers 18A can further include a first electrically conductive layer 26A and a second electrically conductive layer 28A, wherein the first frontside graphite sheet 24A is sandwiched between the first electrically conductive layer 26A and the second electrically conductive layer 28A. The inclusion of these first and second electrically conductive layers 26A, 28A aids in minimizing the CTE mismatch of the frontside build-up layers 18A.

In embodiments including the first backside graphite sheet 24B (See, for example, FIGS. 5 and 7), the first backside graphite sheet 24B can be sandwiched between a third electrically conductive layer 26B and a fourth electrically conductive layer 28B. The inclusion of the third and fourth electrically conductive layers 26B, 28B aids in minimizing the CTE mismatch in the backside build-up layers 18B. A CTE matched first backside graphite sheet is thus formed.

Figure 8A:
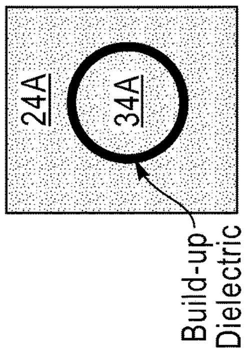
FIG. 8A is a top down view showing an electrical via that is present in the semiconductor packing structure shown in FIGS. 6 and 7.
Figure 8B:
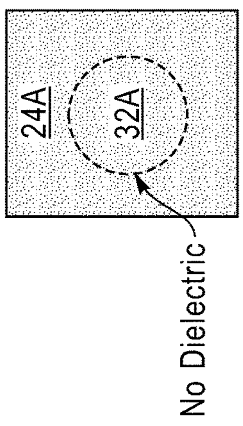
FIG. 8B is a top down view showing a thermal via that is present in the semiconductor packing structure shown in FIGS. 6 and 7.

In the second embodiment and as is shown in FIGS. 5 and 7, the frontside build-up layers 18A can further include a thermal via 32A. In the present application and as is shown in FIG. 8B thermal via 32A is in contact with the first frontside graphite sheet 24A. The thermal via 32A facilitates a vertical thermal conduction path.

In the second embodiment and as is shown in FIGS. 6 and 7, the semiconductor packaging structure can further include semiconductor chip 50 located on the frontside build-up layers 18A and in electrical contact with the at least one second electrically conductive structures 20A that is in electrical contact with the first electrically conductive structure 12/14.

In the second embodiment and is shown in FIGS. 6 and 7, the frontside build-up layers 18A can further include an electrical via 34A for facilitating the electrical contact of the semiconductor chip 50 with the at least one second electrically conductive structures 20A that is in electrical contact with the at first electrically conductive structure 12/14. As is shown in FIG. 8A, the electrical via 32A is isolated from the first frontside graphite sheet 24A by a frontside build-up dielectric material.

In the second embodiment and as is illustrated in FIGS. 6 and 7, the semiconductor packing structure can further include heat spreader 52 having at least one foot 53 in contact with the first frontside graphite sheet 24A. The heat spreader 52 can function as a heat sink in the semiconductor packaging structure of the present application.

In the second embodiment and as is illustrated in FIGS. 6 and 7, the at least one foot 53 of the heat spreader 52 is in contact with the frontside build-up layers 18A by a thermal interface material 54. Thermal interface material 54 facilitates the dissipation of heat from the first frontside graphite sheet into the foot of the thermal spreader.

In the second embodiment and is shown in FIG. 9, the frontside build-up layers 18A can further include a second frontside graphite sheet 25A spaced apart from the first frontside graphite sheet 24A by a frontside build-up dielectric material. In such an embodiment, the first frontside graphite sheet 24A, the frontside build-up dielectric material and the second frontside graphite sheet 25A form a frontside capacitor.

In the second embodiment and as is shown in FIG. 9, the semiconductor packing structure can further include a first backside graphite sheet 24B and a second backside graphite sheet 25B located in a bottom portion of the backside build-up layers 18B, wherein the first backside graphite sheet 24B and the second backside graphite sheet 25B are spaced apart by a backside build-up dielectric material. In such an embodiment, the first backside graphite sheet 24B, the backside build-up dielectric material and the second backside graphite sheet 25B form a backside capacitor. In this embodiment, a bottom electrically conductive layer and an upper electrically conductive layer sandwich the first backside graphite sheet 24B and the second backside graphite sheet 25B such that CTE matched first and second backside graphite sheets are formed.

The various embodiments of the present application will now be described in greater detail. Reference is first made to FIG. 1 which illustrates a portion of a semiconductor packing structure in accordance with the first embodiment of the present application. Notably, the structure illustrated in FIG. 1 includes organic substrate core 10 having frontside 10A and backside 10B. The organic substrate core 10 is composed of an organic material such as, for example, a bismaleimide-triazone (BT) epoxy glass cloth. The organic substrate core 10 can include numerous layers of organic materials. The organic substrate core 10 can be formed utilizing techniques well known to those skilled in the art.

As is illustrated in FIG. 1, the organic substrate core 10 contains at least one first electrically conductive structure 12/14. Each first electrically conductive structure 12/14 is a through via structure that extends from the frontside 10A to the backside 10B of the organic substrate core 10. In some embodiments, and as is illustrated in FIG. 1, the first electrically conductive structure 12/14 includes an electrically conductive liner 14 that is along a sidewall of a polymer 12 present in the organic substrate core 10. The electrically conductive liner 14 is composed of an electrically conductive metal or an electrically conductive metal alloy. Illustrative examples of electrically conductive metals that can be used in the present application include, but are not limited to, copper (Cu), aluminum (Al), tungsten (W), cobalt (Co), ruthenium (Ru), nickel (Ni), iridium (Ir), molybdenum (Mo) or rhodium (Rh). Typically, Cu is used as the electrically conductive material for the electrically conductive liner 14. Polymer 12 can be composed of a polymeric resin. Each first electrically conductive structure 12/14 is formed utilizing techniques that are well known in the art.

Frontside metal pads 16A and backside metal pads 16B are then typically formed as shown in FIG. 1. Each frontside metal pad 16A is formed on the frontside 10A of the pore core 10 and on a surface of at least one of the first electrically conductive structures 12/14. Each backside metal pad 16B is formed on the backside 10B of the pore core 10 and on a surface of at least one of the first electrically conductive structures 12/14. The frontside metal pads 16A and backside metal pads 16B are composed of an electrically conductive metal or electrically conductive metal alloy as defined above. The frontside metal pads 16A and the backside metal pads 16B can be formed by a subtractive etching process. The subtractive etching process includes deposition of an electrically conductive material followed by lithographic patterning of the deposited electrically conductive material. After lithographic patterning, a dielectric layer is formed (by deposition and planarization) adjacent to each frontside metal pad 16A and each backside metal pad 16B. Note this dielectric layer can be part of the frontside build-up layers 18A or the backside build-up layers 18B.

As shown in FIG. 1, frontside build-up layers 18A are located on the frontside 10A of the organic substrate core 10. The frontside build-up layers 18A include a plurality of second electrically conductive structures 20A that are embedded in a frontside stack of build-up dielectric layers. The number of build-up dielectric layers used in providing the frontside build-up layers 18A can vary. Typically, three or more build-up dielectric layers are used in providing the frontside build-up layers 18A. Each second electrically conductive structure 20A is composed of an electrically conductive metal or electrically conductive metal alloy, as defined above. Each build-up dielectric layer within the frontside build-up layers 18A includes a frontside build-up dielectric material. Illustrative examples of frontside build-up dielectric materials include, but are not limited to, an epoxy (i.e., a dielectric adhesive). The second electrically conductive structures 20A can be formed by a damascene process.

In the present application and as is illustrated in FIG. 1, at least one of the second electrically conductive structures 20A is in electrical contact one of the first electrically conductive structures 12/14. In the present application, this electrical contact is established through one of the frontside metal pads 16A as is shown in FIG. 1.

The structure illustrated in FIG. 1 also backside build-up layers 18B located directly on the backside 10B of the organic substrate core 10. The backside build-up layers 18B include a plurality of third electrically conductive structures 20B that are embedded in a backside stack of build-up dielectric layers. The third electrically conductive structures 20B and the backside build-up layers used in forming the backside build-up layers 18B includes materials that are mentioned above for the second electrically conductive structures 20A and frontside build-up dielectric layers used in providing the frontside build-up layers 18A. The backside build-up layers 18B including the plurality of third electrically conductive structures 20B and backside stack of build-up layer dielectric layers can be formed as described above in forming the corresponding frontside build-up layered structure. In the present application, and as is illustrated in FIG. 1, at least one of the third electrically conductive structures 20B is in electrical contact with one of the first electrically conductive structures 12/14. In the present application, this electrical contact is established through one of the backside metal pads 16B as is shown in FIG. 1. It is noted that within the structure illustrated in FIG. 1, an electrically pathway (in a vertical direction) from the backside build-up layers 18B through the electrically conductive structure 12/14 of the organic substrate core 10 and into frontside build-up layers 18A is thus provided.

Referring back to FIG. 1, a frontside laminate 22A is present on an uppermost surface of the frontside build-up layers 18A. The frontside laminate 22A includes a first frontside graphite sheet 24A. Graphite is a crystalline form of the element carbon and it consists of stack layers of graphene. The number of stacked layers of graphene can vary. In the present application, the first frontside graphite sheet 24A includes a plurality of stacked graphene layers. The first frontside graphite sheet 24A can have a thickness from 1 nm to 100000 nm, although other thicknesses for the first frontside graphite sheet 24A can be employed.

The frontside laminate 22A further includes a first electrically conductive layer 26A and a second electrically conductive layer 28A which sandwich, in a vertical manner, the first frontside graphite sheet 24A. The inclusion of the first and second electrically conductive layers 26A, 28A aids in minimizing the CTE mismatch in the frontside laminate 22A. The first electrically conductive layer 26A and the second electrically conductive layer 28A are composed of a compositionally same or substantially CTE matched, electrically conductive metal or electrically conductive metal alloy as defined above. Typically, the first electrically conductive layer 26A and the second electrically conductive layer 28A are both composed of Cu. The frontside laminate 22A further includes a frontside dielectric material 30 that embeds each of the first electrically conductive layer 26A, the first frontside graphite sheet 24A, and the second electrically conductive layer 28A. The frontside dielectric material 30A used in forming the frontside laminate 22A can include, for example, a solder resist, a non-conductive film (NCF), a non-conductive paste (NCP) or an underfill material.

In embodiments, the frontside laminate 22A can further include a thermal via 32A (not shown in FIG. 1, but shown in FIG. 3), wherein the thermal via 32A is in contact with the first frontside graphite sheet 24A as is shown in FIG. 3 and FIG. 4B. The thermal via 32A provides a vertical thermal conduction path from the frontside graphite sheet 24A into the foot 53 of heat spreader 52.

In embodiments, the frontside laminate 22A can further include an electrical via 34A for facilitating the electrical contact of a semiconductor chip 50 (not shown in FIG. 1, but shown FIGS. 2-3) with the at least one second electrically conductive structures 20A that is in electrical contact with the at least one first electrically conductive structure 12/14. In the present application, and to prevent shorting, the electrical via 34A is isolated from the first frontside graphite sheet by the frontside dielectric material 30A (See, for example, FIG. 4A).

In some embodiments, and for large-scaled semiconductor package structures as defined above, the structure illustrated in FIG. 1 further includes first backside graphite sheet 24B. In some embodiments (and is illustrated in FIGS. 1 and 3), the first backside graphite sheet 24B is contained with a lower portion of the backside build-up layers 18B. In other embodiments (not shown), the first backside graphite sheet 24B is present in a backside laminate. When present, the backside laminate is located on a bottommost surface of the backside build-up layers 18B. In either embodiment, the first graphite sheet 24B is positioned between a third electrically conductive layer 26B and a fourth electrically conductive layer 28B; these two electrically conductive layers sandwich the first backside graphite sheet 24B. The inclusion of these electrically conductive layers 26B, 28B aids in minimizing the CTE mismatch in the backside build-up layers 18B or backside laminate. The third electrically conductive layer 26B and the fourth electrically conductive layer 28B are composed of a compositionally same or substantially CTE matched, electrically conductive metal or electrically conductive metal alloy as defined above, and these third and fourth electrically conductive layers are compositionally the same, or substantially CTE matched to the first and second electrically conductive layers 26A, 28A present in the frontside laminate 22A. Typically, the first electrically conductive layer 26A, the second electrically conductive layer 28A, the third electrically conductive layer 26B and the fourth electrically conductive layer 28B are each composed of Cu. The backside laminate can further include a backside dielectric material that embeds each of the third electrically conductive layer 26B, the first backside graphite sheet 24B, and the fourth electrically conductive layer 28B. The backside dielectric material used in forming the backside laminate can include a solder resist, a non-conductive film (NCF), a non-conductive paste (NCP) or an underfill material.

In embodiments, an electrical via 34B is present that can facilitate electrical contact through backside build-up layers 18B or backside laminate. In some embodiments, the electrical via 34B in is isolated from the first backside graphite sheet 24B by a backside build-up dielectric material. In other embodiments, the electrical via 34B in is isolated from the first backside graphite sheet 24B by a backside dielectric material that provides the backside laminate. This isolation is shown in FIG. 4A.

The frontside laminate and, if present, the backside laminate can be formed utilizing techniques well known to those skilled in the art. For example, the frontside and backside laminates can be formed by forming a material stack including a bottom electrically conductive layer, a graphite sheet, and an upper electrically conductive layer on a bottom portion of a dielectric material, patterning that material stack to include via openings, forming another portion of the dielectric material within the via openings and atop the patterned material stack, protecting some of the via openings with a block mask, while removing the dielectric material within the via openings not protected by the block mask, removing the block material and filling each via opening with an electrically conductive material.

When the backside first graphite sheet 24B is present in the backside build-up layers 18B the above process for forming the same into the backside laminate can be adopted here for forming the backside first graphite sheet into the backside build-up layers 18B.

Referring again back to FIG. 1, the illustrated structure can further include solder balls 38 and chip connecting metal pads 40 in contact with the electrically via structures 34A that are present in the frontside laminate 22A. The solder balls 38 include any conventional solder ball material and the chip connecting metal pads 40 include an electrically conductive material as defined above.

Referring now to FIGS. 2 and 3, there is illustrated the semiconductor packing structure illustrated in FIG. 1 (enlarged via only showing the frontside laminate 22A) including semiconductor chips 50 and a heat spreader 52. The frontside laminate 22A shown in FIG. 2 is the same as shown in FIG. 1. In some embodiments, the semiconductor chips 50 can include a plurality of vertical stacked semiconductor chips which can be in a 3Di arrangement. In other embodiments, the semiconductor chips can include BSPDN. In yet other embodiments, the semiconductor chips 50 can include a combination of 3Di chips and BSPN-containing chip. In FIG. 2, the semiconductor chips 50 include two 3Di chips (far left hand side and right hand side of the drawing) are shown flanking a BSPN-containing chip (middle semiconductor chip 50. Each semiconductor chip 50 is in electrical contact with the at least one second electrically conductive structures 20A that is in electrical contact with the at least one first electrically conductive structure 12/14. An underfill material 51 can be present between each semiconductor chip and the frontside laminate 22A.

The heat spreader 52 includes at least one foot 53 in contact with the first frontside graphite sheet 26A. The heat spreader 52 including each foot 53 is composed of thermal conductive material. In the present application, heat spreader 52 typically includes more than one foot 53; this provides improved heat transfer into the remaining body of the heat spreader 52. Although not shown in FIG. 2, but seen in FIG. 3, each foot 53 of the heat spreader 52 is in contact with the frontside laminate 22A by a thermal interface material 54. The thermal interface material 54 includes any material that is inserted between two components in order to enhance the thermal coupling between them. Illustrative examples of that can be employed in the present application include, but are not limited to, thermal pastes and thermal adhesives.

Referring now to FIG. 5, there is illustrated a portion of a semiconductor packing structure in accordance with a second embodiment of the present application. The portion of the semiconductor packaging structure illustrated in FIG. 5 is similar to that depicted in FIG. 1 except that frontside laminate 22A is replaced by forming a CTE matched graphite sheet in the frontside build-up layers 18A. Notably, frontside graphite sheet 24A that is sandwiched between first electrically conductive layer 26A and second electrically conductive layer 28A is formed in the upper portion of the frontside build-up layers 18A. To minimize stress induced warpage within the structure, backside graphite sheet 24B that is sandwiched between third electrically conductive layer 26B and fourth electrically conductive layer 28B is also formed in the a lower portion of the backside build-up layers 18B. Referring now to FIG. 6, there is illustrated the semiconductor packing structure illustrated in FIG. 5 including semiconductor chips 50 and a heat spreader 52, both as described above in regard to FIG. 3. FIG. 7 is enlarged view of the semiconductor packing structure illustrated in FIG. 6.

In embodiments, the frontside build-up layers 18A can further include an electrical via 34A for facilitating the electrical contact of a semiconductor chip 50 (not shown in FIG. 5, but shown FIGS. 6-7) with the at least one second electrically conductive structures 20A that is in electrical contact with the at least one first electrically conductive structure 12/14. In the present application, and to prevent shorting, the electrical via 34A is isolated from the first frontside graphite sheet 24A by build-up dielectric materials (See, for example, FIG. 8A).

In embodiments, frontside build-up layers 18A can further include a thermal via 32A which is in contact with the first frontside graphite sheet 24A as is shown in FIG. 7 and FIG. 8B. The thermal via 32A facilitates a vertical thermal conduction path.

Referring now to FIG. 9, there is illustrated an enlarged cross sectional view of a semiconductor packing structure in accordance with the present application including backside and frontside capacitors. The semiconductor packing structure of this embodiment is similar to the one shown in FIG. 5 above except that the frontside build-up layers 18A includes a CTE matched second frontside graphite sheet, and the backside build-up layers 18B also include a CTE matched second backside graphite sheet. The CTE matched second frontside graphite sheet includes second frontside graphite sheet 25A sandwiched between fifth electrically conductive layer 27A and sixth electrically conductive layer 29A. The fifth and sixth electrically conductive layers 27A, 29A are composed of an electrically conductive material as mentioned above for the first electrically conductive layer 26A. Typically, the first electrically conductive layer 26A, the second electrically conductive layer 28A, the fifth electrically conductive layer 27A and the sixth electrically conductive layer 29A are each composed of a same electrically conductive material, i.e., all are composed of Cu.

The CTE matched second backside graphite sheet includes second backside graphite sheet 25B sandwiched between seventh electrically conductive layer 27B and eight electrically conductive layer 29B. The seventh and eighth electrically conductive layers 27B, 29B are composed of an electrically conductive material as mentioned above for the first electrically conductive layer 26A. Typically, the third electrically conductive layer 26B, the fourth electrically conductive layer 28B, the seventh electrically conductive layer 27B and the eighth electrically conductive layer 29B are each composed of a same electrically conductive material, i.e., all are composed of Cu.

In this embodiment, the CTE matched first frontside graphite sheet and the CTE matched second frontside graphite sheet provide a frontside capacitor, and the CTE matched first backside graphite sheet and the CTE matched second backside graphite sheet provide a backside capacitor.

Although this capacitor embodiment is illustrated as being forming in the build-up layers, the frontside capacitor and backside capacitor can be formed into the laminate embodiment illustrated in FIGS. 1-3 above.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor packaging structure comprising:

an organic substrate core having a frontside and a backside, wherein a first electrically conductive structure extends from the frontside to the backside of the organic substrate core;

frontside build-up layers located on the frontside of the organic substrate core, wherein the frontside build-up layers comprise a plurality of second electrically conductive structures, wherein at least one of the second electrically conductive structures is in electrical contact with the first electrically conductive structure;

backside build-up layers located directly on the backside of the organic substrate core, wherein the backside build-up layers comprise a plurality of third electrically conductive structures, wherein at least one of the third electrically conductive structures is in electrical contact with the first electrically conductive structure; and a frontside laminate comprising a first frontside graphite sheet and located on an uppermost surface of the frontside build-up layers.

2. The semiconductor packaging structure of claim 1, wherein the frontside laminate further comprises a first electrically conductive layer and a second electrically conductive layer, wherein the first frontside graphite sheet is sandwiched between the first electrically conductive layer and the second electrically conductive layer.

3. The semiconductor packaging structure of claim 2, further comprising a first backside graphite sheet located in the backside build-up layers, wherein the first backside graphite sheet is sandwiched between a third electrically conductive layer and a fourth electrically conductive layer.

4. The semiconductor packaging structure of claim 1, wherein the frontside laminate further comprises a thermal via, wherein the thermal via is in contact with the first frontside graphite sheet.

5. The semiconductor packaging structure of claim 1, further comprising a semiconductor chip located on the frontside laminate and in electrical contact with the at least one second electrically conductive structures that is in electrical contact with the at least one first electrically conductive structure.

6. The semiconductor packaging structure of claim 5, wherein the frontside laminate further comprises an electrical via for facilitating the electrical contact of the semiconductor chip with the at least one second electrically conductive structures that is in electrical contact with the at least one first electrically conductive structure, wherein the electrical via is isolated from the first frontside graphite sheet by a frontside dielectric material.

7. The semiconductor packaging structure of claim 1, further comprising a heat spreader having at least one foot in contact with the first frontside graphite sheet.

8. The semiconductor packaging structure of claim 1, wherein the at least one foot of the heat spreader is in contact with the frontside laminate by a thermal interface material.

9. The semiconductor packaging structure of claim 1, wherein the frontside laminate comprises a second frontside graphite sheet spaced apart from the first frontside graphite sheet by a frontside dielectric material, wherein the first frontside graphite sheet, the frontside dielectric material and the second frontside graphite sheet form a frontside capacitor.

10. The semiconductor packaging structure of claim 9, further comprising a first backside graphite sheet and a second graphite sheet located in the backside build-up layers, wherein the first backside graphite sheet and the second frontside graphite sheet are spaced apart by a backside build-up dielectric material, wherein the first backside graphite sheet, the second backside graphite sheet and the backside build-up dielectric material provide a backside capacitor.

11. A semiconductor packaging structure comprising:

an organic substrate core having a frontside and a backside, wherein a first electrically conductive structure extends from the frontside to the backside of the organic substrate core;

frontside build-up layers located on the frontside of the organic substrate core, wherein the frontside build-up layers comprise a first frontside graphite sheet and a plurality of second electrically conductive structures, wherein the frontside graphite sheet is located in upper portion of the frontside build-up layers and wherein at least one of the second electrically conductive structures is in electrical contact with the first electrically conductive structure; and backside build-up layers located directly on the backside of the organic substrate core, wherein the backside build-up layers comprise a plurality of third electrically conductive structures, wherein at least one of the third electrically conductive structures is in electrical contact with the first electrically conductive structure.

12. The semiconductor packaging structure of claim 11, wherein the frontside build-up layers further comprise a first electrically conductive layer and a second electrically conductive layer, wherein the first frontside graphite sheet is sandwiched between the first electrically conductive layer and the second electrically conductive layer.

13. The semiconductor packaging structure of claim 11, further comprising a first backside graphite sheet located in a bottom portion of the backside build-up layers, wherein the first backside graphite sheet is sandwiched between a third electrically conductive layer and a fourth electrically conductive layer.

14. The semiconductor packaging structure of claim 11, wherein the frontside build-up layers further comprise a thermal via, wherein the thermal via is in contact with the first frontside graphite sheet.

15. The semiconductor packaging structure of claim 11, further comprising a semiconductor chip located on the frontside build-up layers and in electrical contact with the at least one second electrically conductive structures that is in electrical contact with the at least one first electrically conductive structure.

16. The semiconductor packaging structure of claim 15, wherein the frontside build-up layers further comprise an electrical via for facilitating the electrical contact of the semiconductor chip with the at least one second electrically conductive structures that is in electrical contact with the at least one first electrically conductive structure, wherein the electrical via is isolated from the first frontside graphite sheet by a frontside build-up dielectric material.

17. The semiconductor packaging structure of claim 11, further comprising a heat spreader having at least one foot in contact with the first frontside graphite sheet.

18. The semiconductor packaging structure of claim 11, wherein the at least one foot of the heat spreader is in contact with the frontside build-up layers by a thermal interface material.

19. The semiconductor packaging structure of claim 11, wherein the frontside build-up layers further comprise a second frontside graphite sheet spaced apart from the first frontside graphite sheet by a frontside build-up dielectric material, wherein the first frontside graphite sheet, the frontside build-up dielectric material and the second frontside graphite sheet form a frontside capacitor.

20. The semiconductor packaging structure of claim 19, further comprising a first backside graphite sheet and a second backside graphite sheet located in a bottom portion of the backside build-up layers, wherein the first backside graphite sheet and the second backside graphite sheet are spaced apart by a backside build-up dielectric material, and wherein the first backside graphite sheet, the backside build-up dielectric material and the second backside graphite sheet form a backside capacitor.

* * * * *